United States Patent
Daami et al.

(10) Patent No.: US 11,121,295 B2
(45) Date of Patent: Sep. 14, 2021

(54) METHOD OF ADAPTING LIGHT EXTRACTION FROM A LIGHT EMITTING DIODE

(71) Applicant: Commissariat A L'Energie Atomique et aux Energies Alternatives, Paris (FR)

(72) Inventors: Anis Daami, Grenoble (FR); Marianne Consonni, Grenoble (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 16/702,664

(22) Filed: Dec. 4, 2019

(65) Prior Publication Data

US 2020/0185578 A1 Jun. 11, 2020

(30) Foreign Application Priority Data

Dec. 6, 2018 (FR) ..................... 18 72425

(51) Int. Cl.
*H01L 33/58* (2010.01)
*H01L 33/00* (2010.01)
*H01L 33/30* (2010.01)
*H01L 33/54* (2010.01)

(52) U.S. Cl.
CPC .......... *H01L 33/58* (2013.01); *H01L 33/0062* (2013.01); *H01L 33/0095* (2013.01); *H01L 33/30* (2013.01); *H01L 33/54* (2013.01); *H01L 2933/005* (2013.01); *H01L 2933/0058* (2013.01)

(58) Field of Classification Search
CPC ..... H01L 33/58; H01L 33/52; H01L 33/0062; H01L 33/0095; H01L 33/30; H01L 33/54
See application file for complete search history.

(56) References Cited

U.S. PATENT DOCUMENTS

| 3,834,883 A | 9/1974 | Klein |
| 2007/0018183 A1 | 1/2007 | Denbaars et al. |
| 2016/0111597 A1 | 4/2016 | Chen |

FOREIGN PATENT DOCUMENTS

| JP | 2003-282938 A | 10/2003 |
| WO | WO 2013/179185 A1 | 12/2013 |

OTHER PUBLICATIONS

French Preliminary Search Report dated Jul. 19, 2019 in French Application 18 72425 filed on Dec. 6, 2018 (with English Translation of Categories of Cited Documents).
Olivier, F, et al., "Shockley-Read-Hall and Auger non-radiative recombination in GaN based LEDs: A size effect study", Applied Physics Letters, vol. 111, No. 2, 2017, 6 pages.

(Continued)

*Primary Examiner* — Changhyun Yi
(74) *Attorney, Agent, or Firm* — Oblon, McClelland, Maier & Neustadt, L.L.P.

(57) ABSTRACT

A method of adapting light extraction LEE from at least one light emitting diode with surface area S and perimeter P includes a step to encapsulate the light emitting diode with an encapsulation layer with a refraction index N, the refraction index N being determined based on a model taking account of an internal quantum efficiency of the light emitting diode. The extraction of light resulting from use of the encapsulation layer is such that the light emitting diode can achieve a predetermined external quantum efficiency.

11 Claims, 5 Drawing Sheets

(56) References Cited

OTHER PUBLICATIONS

Ma, M, et al., "Effects of the refractive index of the encapsulant on the light-extraction efficiency of light-emitting diodes", Optics Express, vol. 19, No. S5, 2011, pp. A1135-A1140.
Moulin, G, et al., "An Efficient Process of Surface Modification and Patterning for LED Encapsulation", IEEE Transactions on Components, Packaging, and Manufacturing Technology, vol. 8, No. 5, 2018, pp. 904-909.
U.S. Appl. No. 16/668,954, filed Oct. 30, 2019, Daami, A, et al.

METHOD OF ADAPTING LIGHT EXTRACTION FROM A LIGHT EMITTING DIODE

TECHNICAL FIELD

This invention relates to a method of manufacturing light emitting diodes. In particular, this invention relates to a method of manufacturing light emitting diodes by which the external quantum efficiency of said diodes can be adjusted to a predetermined value, particularly a maximum value.

STATE OF PRIOR ART

The external quantum efficiency of light emitting diodes is defined by the product of the internal quantum efficiency (IQE) and the light extraction efficiency (LEE).

The latter term, generally less than one, takes account of parasite phenomena that have the consequence of degrading the global efficiency of light emitting diodes.

The preponderant role among these parasite phenomena is played by internal reflections and/or reabsorption of light radiation by light emitting diodes.

Thus, in order to optimise the efficiency of light extraction, it has been suggested that a texture can be created on some surfaces of diodes in order to limit internal reflections.

In this regard, document [1] cited at the end of the description, discloses light emitting diodes covered by a textured layer and particularly a rough textured layer.

Alternatively, document [2] cited at the end of the description, discloses light emitting diodes that rest on a network of structures, and particularly conical structures.

Finally, documents [3] and [4], cited at the end of the description, disclose texturing of an exposed surface of light emitting diodes.

However, texturing methods known in prior art are not satisfactory.

The inventors have observed that the external quantum efficiency of a diode is also dependent on the size, and particularly the aspect ratio of the surface of said diode.

More particularly, as illustrated in FIG. 1, the quantum efficiency reduces as the size of the diode reduces.

Furthermore, the maximum efficiency is reached for current densities that increase as the size of the diode reduces.

Thus, the texture as disclosed in the above-mentioned documents makes it difficult to achieve a maximum external quantum efficiency, and especially dependent on the size of the diode concerned.

To the extent that small diodes are now widely used in optical devices, and particularly in high resolution displays, it is essential to be able to solve the problem that arises due to optimisation of the external quantum efficiency.

Thus, the purpose of this invention is to disclose a method of adapting the external quantum efficiency of light emitting diodes.

Another purpose of this invention is to disclose a method of maximising the external quantum efficiency of light emitting diodes.

PRESENTATION OF THE INVENTION

The purposes of this invention are at least partly achieved by a method of adapting light extraction LEE from at least one light emitting diode with surface area S and perimeter P, the method being characterised in that it comprises a step to encapsulate the light emitting diode with an encapsulation layer with a refraction index N, the refraction index N being determined based on a model taking account of an internal quantum efficiency IQE of the light emitting diode, and such that extraction of light resulting from use of the encapsulation layer is such that the light emitting diode can achieve a predetermined external quantum efficiency $EQE_K$.

According to one embodiment, the model is a function of the surface area S and the perimeter P of the light emitting diode.

According to one embodiment, the model taking account of the internal quantum efficiency satisfies the following relation:

$$IQE = \frac{B \cdot n^2}{A' \cdot \frac{P}{S} \cdot n + B \cdot n^2 + C \cdot n^3}$$

In which:

$$A' \cdot \frac{P}{S}$$

is an SRH non-radiative recombination coefficient,
B is a radiative recombination coefficient,
C is an Auger non-radiative recombination coefficient,
n is an injected carriers density,
P is the perimeter of the light emitting diode, and
S is the surface area of the light emitting diode.

According to one embodiment, determination of the refraction index N comprises a simulation of the path of light rays emitted by a Lambertian source encapsulated by the encapsulation layer.

According to one embodiment, the simulation is made for a range of refraction indices of the encapsulation layer.

According to one embodiment, determination of the refraction index N comprises the construction of an abacus illustrating the relation between light extraction allowed by the encapsulation layer and required light extraction so that the external quantum efficiency of the diode is equal to the predetermined external quantum efficiency $EQE_K$.

According to one embodiment, the predetermined external quantum efficiency $EQE_K$ corresponds to a maximum value of the external quantum efficiency that can be achieved by the light emitting diode.

According to one embodiment, the encapsulation layer forms a dome.

According to one embodiment, the perimeter P to surface area S ratio is more than one tenth.

According to one embodiment, the light extraction LEE of a plurality of essentially identical light emitting diodes is adapted.

According to one embodiment, the light extraction LEE of a plurality of different sizes of light emitting diodes is adapted.

According to one embodiment, the at least one light emitting diode comprises a stack of III-V semiconducting materials.

BRIEF DESCRIPTION OF THE DRAWINGS

Other characteristics and advantages will become clear in the following description of a method of adapting the external quantum efficiency of a light emitting diode, given as non-limitative examples, with reference to the appended drawings in which:

FIG. 5a represents in particular the external quantum efficiency of a light emitting diode with (curve 1) and without (curve 2) gain relative to modulation of light extraction as a function of the size of said diode (horizontal axis, in "µm"), FIG. 5b represents the required gain applied for each diode size;

DETAILED PRESENTATION OF PARTICULAR EMBODIMENTS

Thus, the purpose of this invention is to disclose a method of adapting the external quantum efficiency of light emitting diodes. In particular, this invention relates to encapsulation of a light emitting diode by an encapsulation layer, the refraction index N of which is adjusted such that said diode has a predetermined external quantum efficiency, and particularly a maximum external quantum efficiency.

The refraction index is determined by modelling internal and external quantum efficiencies of the diode.

Figure 2:
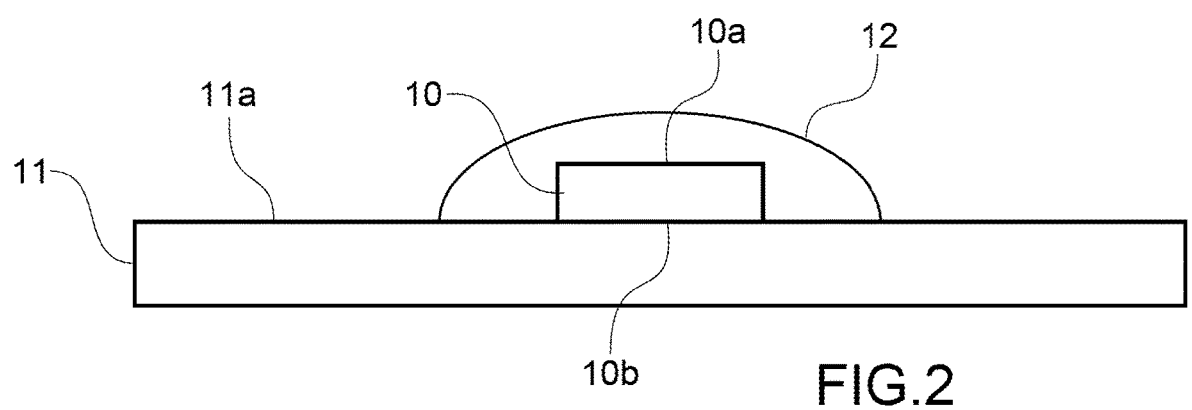
FIG. 2 is a diagrammatic representation of a light emitting diode supported through its back face on a front face of a support substrate, used in the framework of this invention.

FIG. 2 is a diagrammatic representation of a light emitting diode 10 used in the context of this invention, "Light emitting diode" refers generally to a structure that emits light radiation through a face called the light emitting face 10a, whenever a current passes through it.

"Light radiation" means for example radiation in a range of wavelengths in the visible range, for example in a range of wavelengths between 400 nm and 700 nm.

The light emitting diode comprises a face opposite the light emitting face 10a, and called the back face 10b.

The light emitting diode is supported through its back face 10b on the front face of the support substrate 11.

The light emitting diode 10 is formed from a stack of layers that includes an active layer intercalated between a first semiconducting layer and a second semiconducting layer.

The first semiconducting layer may include an n-doped III-V semiconducting material, and particularly n type GaN (n type means doped with electron donor species).

The second semiconductor layer may include a p-doped III-V semiconducting material, particularly p type GaN (p type means doped with hole donor species).

The active layer may comprise at least one material chosen from among: GaN, GaAs, InGaN, InGaAlP. The active layer may also comprise a ternary or quaternary alloy of III-V semiconductors.

The active layer, the first semiconducting layer and the second semiconducting layer may be formed using epitaxial film deposition techniques on the front face 11a of the support substrate 11.

Formation of said layers makes use of techniques known to an expert in the subject and therefore will not be described in detail in this invention.

The light emitting diode has a surface area S and a perimeter P.

"Surface area S" of the light emitting diode refers to the surface of the light emitting diode 10a.

"Perimeter P" of the light emitting diode refers to the perimeter of the light emitting diode 10a.

The method according to this invention comprises an encapsulation step of the light emitting diode with an encapsulation 12 with index N.

It is understood, without it being necessary to state it, that the index N is considered at the wave length λ of the light radiation emitted by the light emitting diode.

According to this invention, the index N of the encapsulation layer is adjusted such that the external quantum efficiency of the light emitting diode is equal to a predetermined external quantum efficiency $EQE_k$.

A method of determining the index N satisfying this objective can make use of a model of external and internal quantum efficiencies of a light emitting diode.

The remaining part of the disclosure presents an example, particularly to achieve a maximum external quantum efficiency denoted $EQE_{max}$. However, it is important to note that an expert in the subject, with his general knowledge, and the following description, can consider an external quantum efficiency less than the maximum external quantum efficiency.

The maximum external quantum efficiency that can be achieved by a light emitting diode is governed by the stack of layers forming this diode. However, the maximum external quantum efficiency can only be achieved under particular conditions for extraction of light radiation emitted by the light emitting diode.

Thus, as specified above, the invention discloses a method of adjusting the refraction index N of the encapsulation layer such that the external quantum efficiency of the diode, for a given size, is equal to the maximum external quantum efficiency $EQE_{max}$.

The external quantum efficiency of a light emitting diode satisfies the relation (1).

$$DQE = IQE \times LEE \qquad (1)$$

In which "IQE" represents the internal quantum efficiency of the light emitting diode, and "LEE" represents the light extraction efficiency.

Document [5] starts by using a model in the literature, called the ABC model, to derive the internal quantum efficiency of a light emitting diode.

Figure 1:
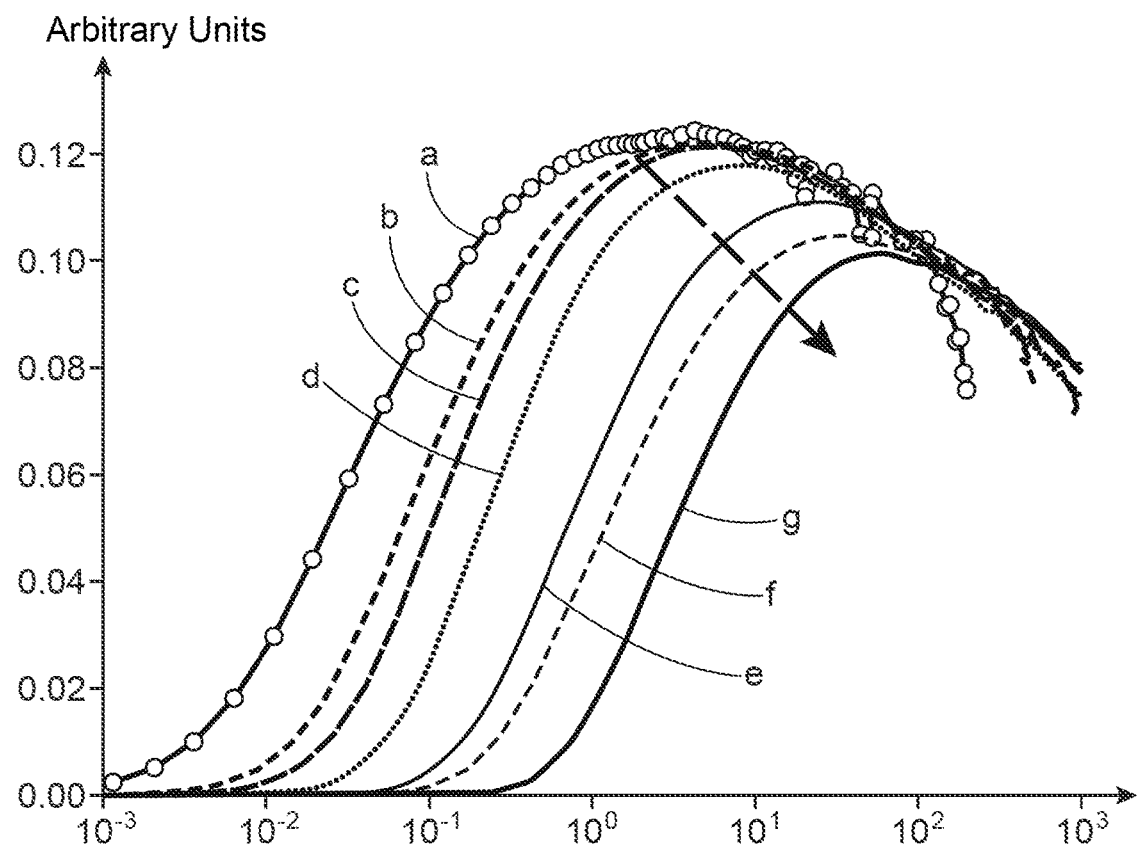
FIG. 1 is a graphic representation of the external quantum efficiency of a light emitting diode (along the vertical axis, in arbitrary units with a maximum equal to 1) as a function of the density of the current passing through said diode (horizontal axis, "A/cm$^2$", the different curves "a", "b", "c", "d", "e", "f", and "g" being relative to light emitting diodes with side dimensions of 500 µm, 200 µm, 100 µm, 50 µm, 20 µm, 15 µm and 10 µm respectively.

However, the ABC model as disclosed in the literature [5] does not take account of the effect of the size of the light emitting diode on the quantum efficiency as illustrated in FIG. 1.

Therefore the inventors propose to mitigate this weakness by modifying the ABC model as follows (equation (2)).

$$IQE = \frac{B \cdot n^2}{A' \cdot \frac{P}{S} \cdot n + B \cdot n^2 + C \cdot n^3} \qquad (2)$$

In which:
$A'.P/S$ is an Shockley-Hall-Read non-radiative recombination coefficient, adapted to the geometry of the diode,
B is a radiative recombination coefficient,
C is an Auger non-radiative recombination coefficient,
n is an injected carriers density,
P is the perimeter of the light emitting diode, and
S is the surface area of the light emitting diode.

Figure 3:
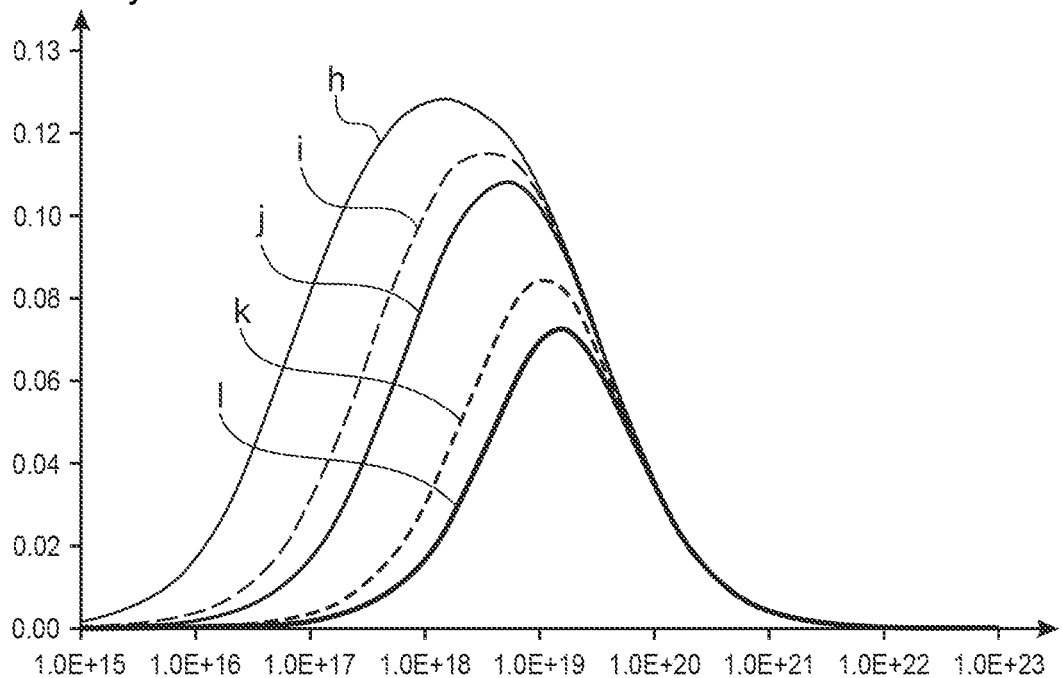
FIG. 3 is a graphic representation of the external quantum efficiency of a light emitting diode (along the vertical axis, in arbitrary units with a maximum equal to 1) as a function of the density of carriers passing through said diode (horizontal axis, "cm$^{-3}$" obtained by simulation, the different curves "h", "i", "j", "k", and "l" being relative to light emitting diodes with side dimensions of 500 µm, 100 µm, 50 µm, 10 µm and 5 µm respectively.

A simulation of the external quantum efficiency based on this ABC model modified as a function of the size of the light emitting diodes and assuming a light extraction of 0.14, is shown on FIG. 3. This simulation is conforming with the experimental results in FIG. 1, thus validating the relation (2).

Thus, considering the size of the light emitting diode and through relation (2), the maximum value of the internal quantum efficiency $IQE_{max}$ of said diode satisfies relation (3).

$$IQE\max = \frac{1}{1 + 2 \cdot \left(\frac{C}{B}\right) \cdot \left(\frac{A'}{C}\right)^{1/2} \sqrt{P/S}} \qquad (3)$$

Light extraction LEE such that the light emitting diode can have a maximum external quantum efficiency $EQE_{max}=K$, regardless of the size of said diode, satisfies relation (4).

$$LEE = K\left(1 + \alpha\sqrt{\frac{P}{S}}\right) \text{ with } \alpha = \frac{2}{B}\sqrt{A' \cdot C} \qquad (4)$$

Figure 4:
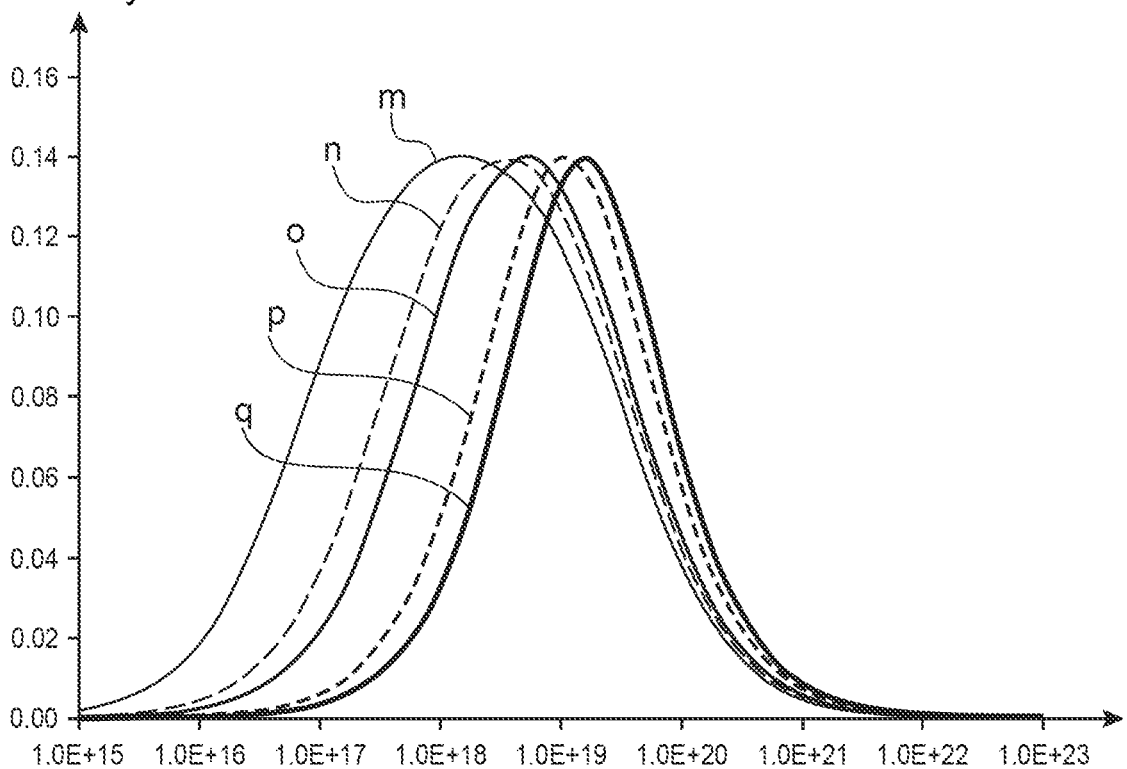
FIG. 4 is a graphic representation of the external quantum efficiency of a light emitting diode (along the vertical axis, in arbitrary units with a maximum equal to 1) as a function of the density of carriers passing through said diode (horizontal axis, "cm$^{-3}$" obtained by simulation and modulation of light extraction, the different curves "m", "n", "o", "p", and "q" being relative to light emitting diodes with side dimensions of 500 µm, 100 µm, 50 µm, 10 µm and 5 µm respectively.

As illustrated on FIG. 4, modulation of light extraction as a function of the size of the light emitting diode is such that this diode has a maximum external quantum efficiency regardless of its size. Nevertheless, the shift towards increasing current densities as the size of the light emitting diode reduces, still occurs.

Therefore relation (4) represents a gain to be applied to the internal quantum efficiency of a light emitting diode such that the external quantum efficiency of this light emitting diode is maximum.

Figure 5A:
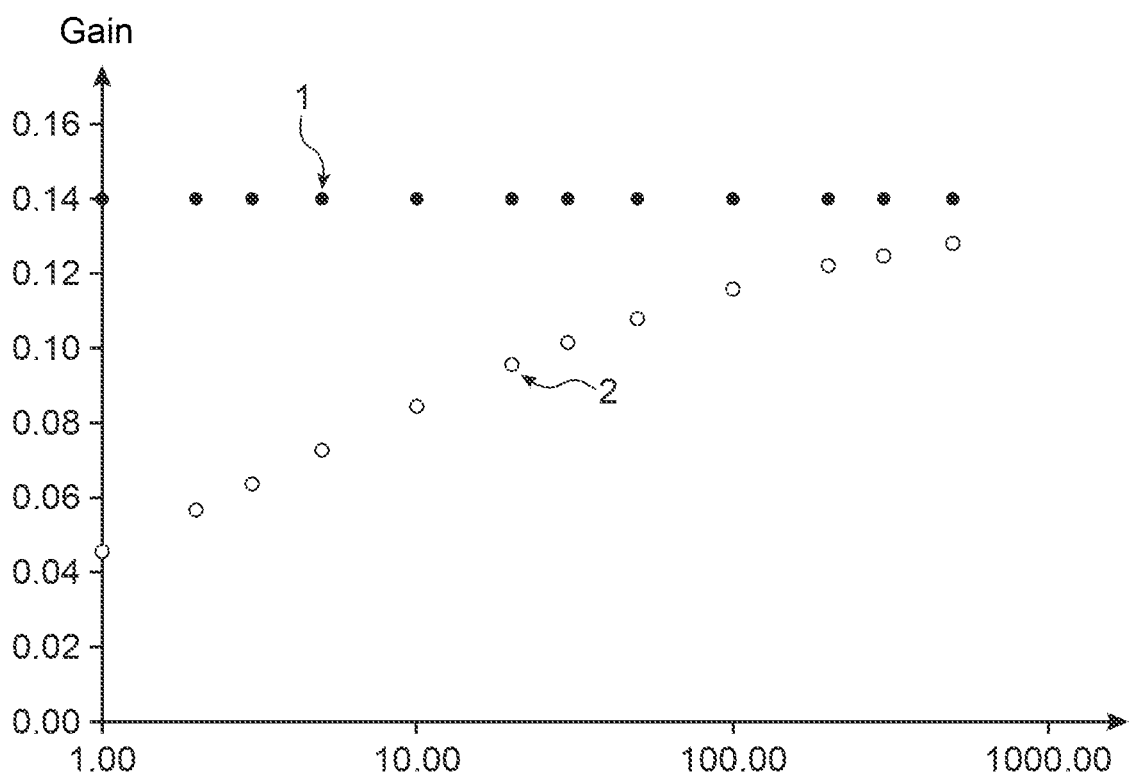
FIGS. 5A and 5B are illustrations of the variation of the gain.
Figure 5B:
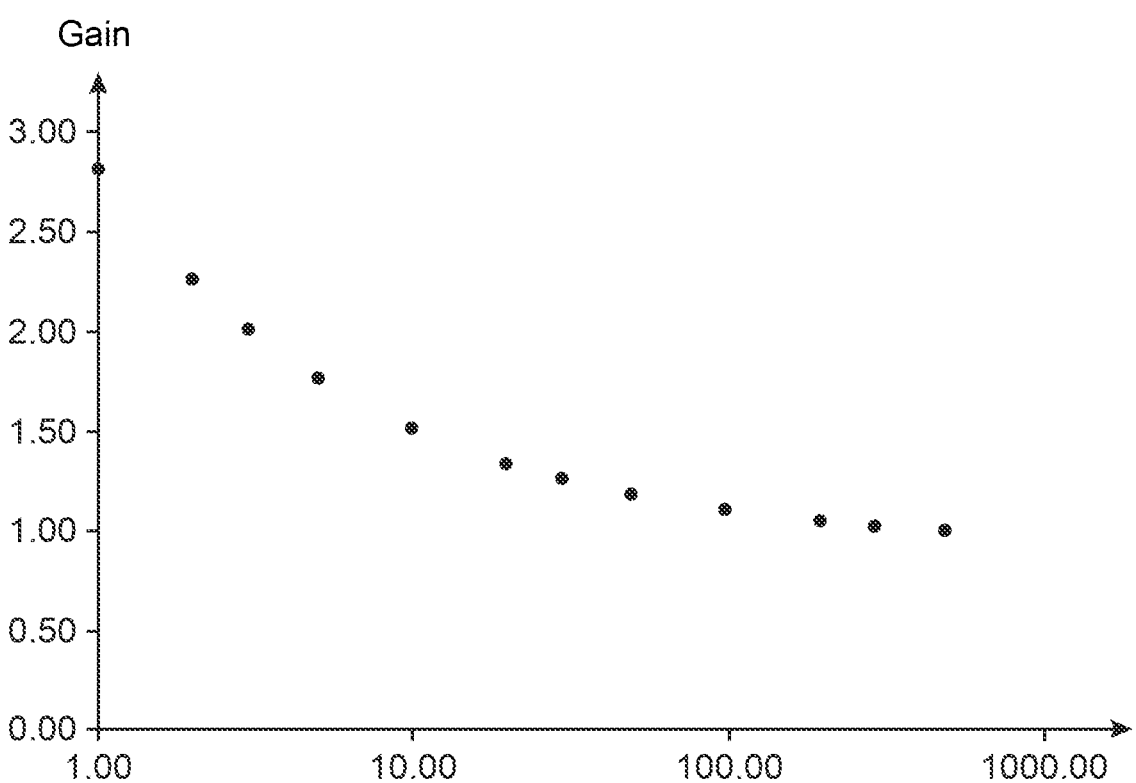

FIGS. 5a and 5b are illustrations of the variation of such a gain. In particular, FIG. 5a represents the external quantum efficiency of a light emitting diode with (curve 1) and without (curve 2) gain relative to modulation of light extraction as a function of the size of said diode.

FIG. 5b represents the gain to be applied for each diode size necessary to achieve maximum external quantum efficiency.

Knowledge of the gain to be applied then makes it possible to size the encapsulation layer in terms of the refraction index N such that the external quantum efficiency of the light emitting diode is equal to the maximum external quantum efficiency $EQE_{max}$.

In particular, this sizing may include an optical simulation of light extraction through the encapsulation layer as a function of the refraction index of this layer.

Figure 6:
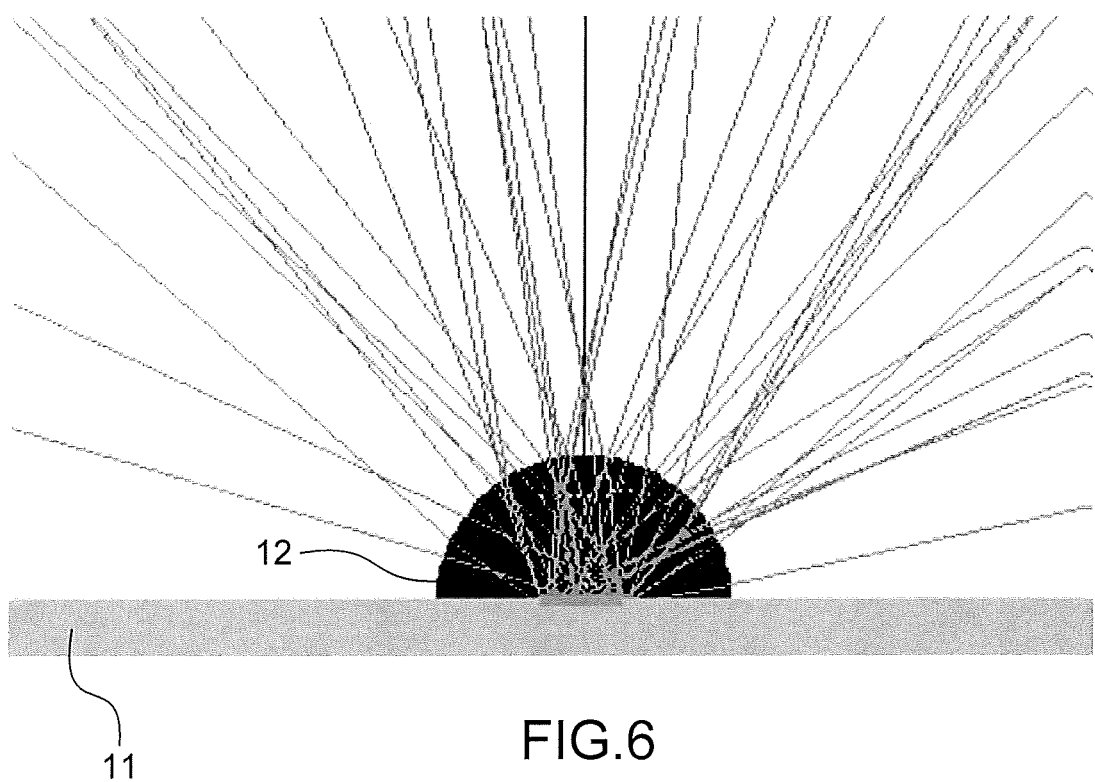
FIG. 6 is a diagrammatic representation of light radiation output from a diode encapsulated by an encapsulation layer.

This simulation may involve the determination of different light rays emitted by a Lambertian source for a given range of refraction indices (for example varying between 1 and 2.4). FIG. 6 contains an example of such a simulation, assuming a dome-shaped encapsulation layer at the centre of which there is a light radiation source.

An abacus (FIG. 7) defining a correspondence between the geometry, and particularly the perimeter P to surface area S ratio, of the light emitting diode and the refraction index N of the encapsulation layer, can then be constructed based on this simulation.

Figure 7:
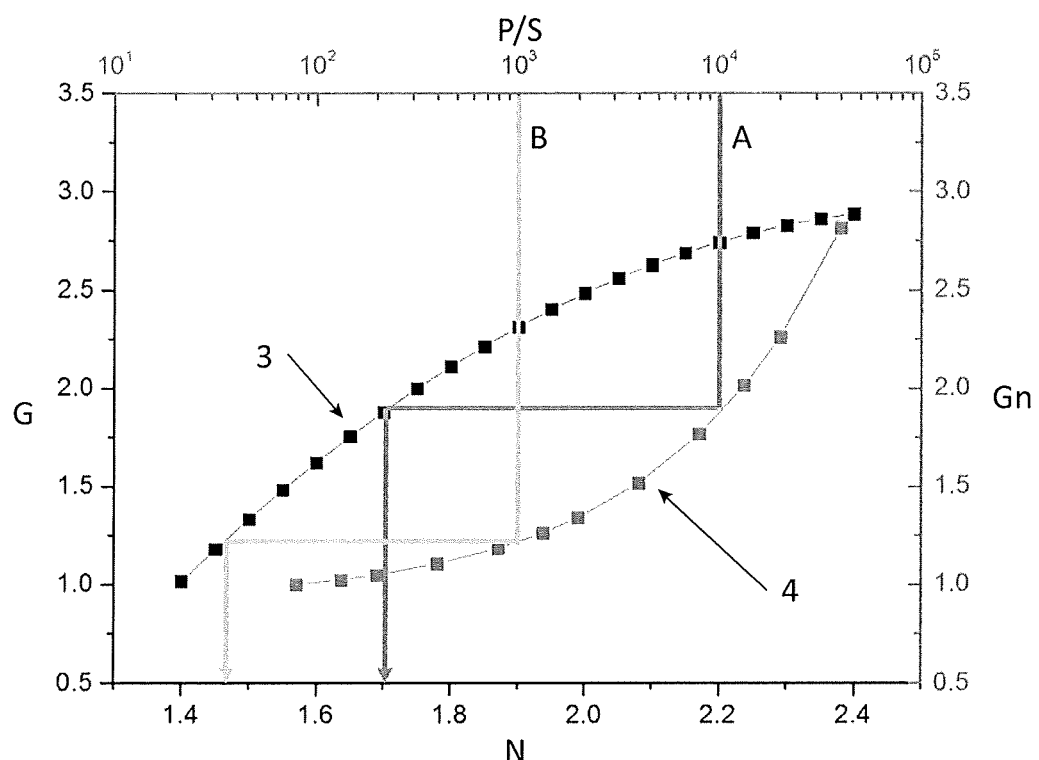
FIG. 7 is an abacus that, depending on the geometry of the diode, can be used to determine the refraction index N of the encapsulation layer such that the external quantum efficiency of said diode is maximum, in particular curve 3 represents the gain G (vertical axis, left) associated with the encapsulation layer as a function of the refraction index N (lower horizontal axis) while curve 4 represents the required gain Gn (right vertical axis) as a function of the perimeter P to surface area S ratio (upper horizontal axis) of the light emitting diode.

In this respect, FIG. 7 can be used to determine the refraction index of the encapsulation layer necessary to achieve the maximum external quantum efficiency, as a function of the geometry of the diode. In particular, curve 3 represents the gain G (vertical axis, left) associated with the encapsulation layer as a function of the refraction index N (lower horizontal axis), while curve 4 represents the required gain Gn (right vertical axis) as a function of the perimeter P to surface area S ratio of the light emitting diode (upper horizontal axis).

For example, for a P/S ratio=$10^4$, the required gain to maximise the external quantum efficiency of the diode is about 1.8. This required gain is obtained for an encapsulation layer with a refraction index N equal to 1.7 (path "A").

Also for example, for a P/S ratio=$10^3$, the required gain to maximise the external quantum efficiency of the diode is about 1.2. This required gain is obtained for an encapsulation layer with a refraction index N equal to 1.48 (path "B").

Figure 8:
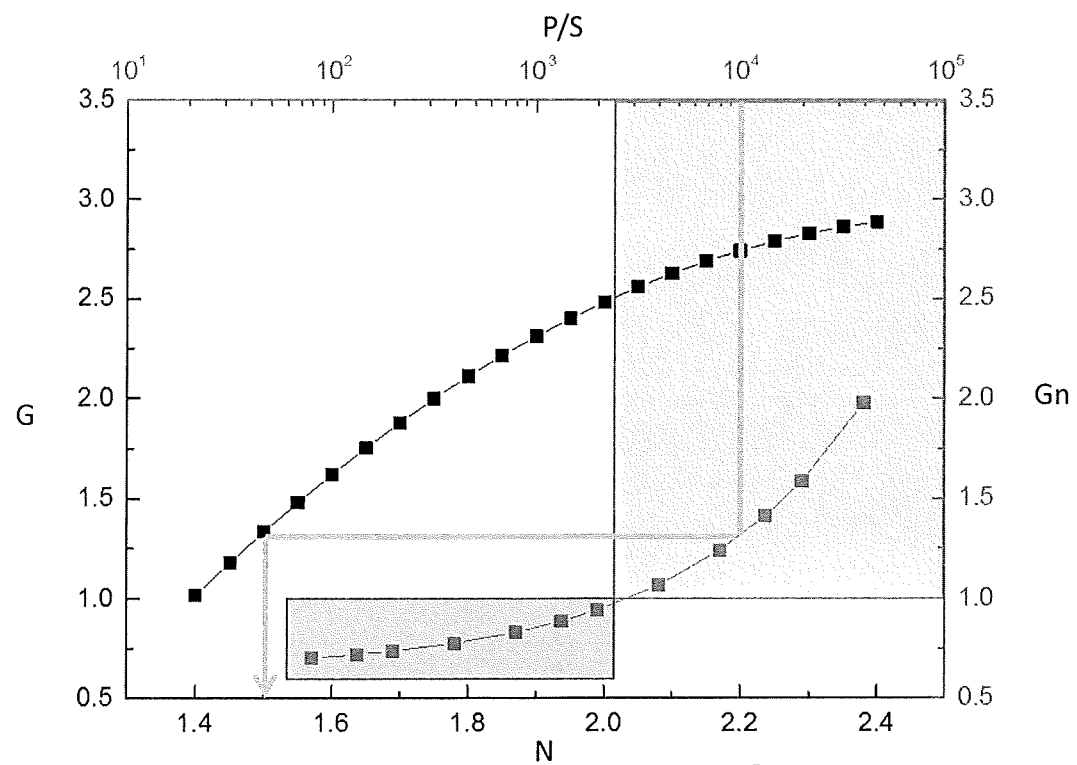
FIG. 8 is an abacus constructed on the same principles as the abacus in FIG. 7, with the objective of determining a refraction index of the encapsulation layer for which the external quantum efficiency of the diode is less than the maximum external quantum efficiency of said diode.

The abacus presented in FIG. 7 applies to a maximum external quantum efficiency. However, the method disclosed in the context of this invention is applicable to any other efficiency less than the maximum external quantum efficiency. In particular, FIG. 8 is an abacus constructed based on a quantum efficiency to be achieved less than the maximum quantum efficiency. In particular, the external quantum efficiency considered in FIG. 8 is equal to 0.09 instead of an $EQE_{max}$ of 0.14.

The method according to the invention can advantageously be used to adjust light extraction from a plurality of diodes, for example such that the external quantum efficiency of these diodes is maximum. These diodes may be identical, or they may be different sizes.

Advantageously the diodes may form a display.

In a manner complementary to this invention, the encapsulation layer may be textured on its exposed surface.

REFERENCES

[1] US 2007/018183;
[2] US 2016/111597;
[3] JP2003282938;
[4] WO2013/179185;
[5] F. Olivier et al., "*Shockley-Read-Hall and Auger non-radiative recombination in GaN based LEDs: A size effect study*" Appl. Phys. Lett. VOL. 111, No. 2, pp. 62022104, July 2017.

The invention claimed is:

1. A method of adapting light extraction efficiency from at least one light emitting diode with a surface area and a perimeter, comprising:
encapsulating the light emitting diode with an encapsulation layer with a refraction index, the refraction index being determined based on a model taking account of an internal quantum efficiency (IQE) of the light emitting diode,
wherein extraction of light resulting from use of the encapsulation layer is such that the light emitting diode can achieve a predetermined external quantum efficiency, and
wherein the model is a function of the surface area and the perimeter of the light emitting diode.

2. The method according to claim 1, wherein the model taking account of the internal quantum efficiency satisfies the following relation:

$$IQE = \frac{B \cdot n^2}{A' \cdot \frac{P}{S} \cdot n + B \cdot n^2 + C \cdot n^3}$$

In which:
A'–P/S is an Shockley-Hall-Read non-radiative recombination coefficient,
B is a radiative recombination coefficient,
C is an Auger non-radiative recombination coefficient, and
n is an injected carriers density.

3. The method according to claim 1, wherein determination of the refraction index comprises a simulation of a path of light rays emitted by a Lambertian source encapsulated by the encapsulation layer.

4. The method according to claim 3, wherein the simulation is made for a range of refraction indices of the encapsulation layer.

5. The method according to claim 4, wherein determination of the refraction index comprises construction of an abacus illustrating a relation between light extraction allowed by the encapsulation layer and required light extraction so that the external quantum efficiency of the diode is equal to the predetermined external quantum efficiency.

6. The method according to claim 1, wherein the predetermined external quantum efficiency corresponds to a maximum value of the external quantum efficiency that can be achieved by the light emitting diode.

7. The method according to claim 1, wherein the encapsulation layer forms a dome.

8. The method according to claim 1, wherein the perimeter to the surface area ratio is more than one tenth.

9. The method according to claim 1, wherein the light extraction efficiency of a plurality of identical light emitting diodes is adapted.

10. The method according to claim 1, wherein the light extraction efficiency of a plurality of different sizes of light emitting diodes is adapted.

11. The method according to claim 1, wherein the at least one light emitting diode comprises a stack of III-V semiconducting materials.

* * * * *